United States Patent
Asztalos et al.

(10) Patent No.: US 8,704,093 B2
(45) Date of Patent: Apr. 22, 2014

(54) SHIELDED WIREWAY SYSTEMS

(75) Inventors: Michael D. Asztalos, Orland Park, IL (US); Rami A. Mishal, Plainfield, IL (US); Masud Bolouri-Saransar, Orland Park, IL (US); Ronald A. Nordin, Naperville, IL (US)

(73) Assignee: Panduit Corp., Tinley Park, IL (US)

( * ) Notice: Subject to any disclaimer, the term of this patent is extended or adjusted under 35 U.S.C. 154(b) by 31 days.

(21) Appl. No.: 13/323,318

(22) Filed: Dec. 12, 2011

(65) Prior Publication Data

US 2012/0152588 A1 Jun. 21, 2012

Related U.S. Application Data

(60) Provisional application No. 61/424,740, filed on Dec. 20, 2010.

(51) Int. Cl.
*H02G 3/04* (2006.01)

(52) U.S. Cl.
USPC ........ 174/68.3; 174/68.1; 174/481; 52/220.7; 138/155

(58) Field of Classification Search
USPC ......... 174/480, 481, 68.1, 68.3, 72 A, 97, 98, 174/482, 500, 135, 101, 66, 67; 220/3.2–3.9, 4.02; 248/49, 65; 211/26; 385/134, 135; 52/220.5, 220.7; D13/155; 138/158, 155, 156, 162

See application file for complete search history.

(56) References Cited

U.S. PATENT DOCUMENTS

| | | | |
|---|---|---|---|
| 3,156,765 A | 11/1964 | Weiss | |
| 3,809,799 A | 5/1974 | Taylor | |
| 3,890,459 A | 6/1975 | Caveney | |
| 3,968,322 A * | 7/1976 | Taylor | 174/72 A |
| 5,126,507 A | 6/1992 | Kirma | |
| 6,437,243 B1 | 8/2002 | VanderVelde et al. | |
| D466,483 S | 12/2002 | Stoneberger | |
| 6,803,519 B2 * | 10/2004 | de la Borbolla et al. | 174/480 |
| 6,872,888 B2 | 3/2005 | Santelli, Jr. | |
| 7,060,893 B1 * | 6/2006 | Villi | 174/68.3 |
| 7,075,010 B2 | 7/2006 | Santelli, Jr. | |
| 7,348,488 B2 * | 3/2008 | Benito-Navazo | 174/72 A |
| 7,491,904 B2 * | 2/2009 | Villi | 174/481 |

(Continued)

FOREIGN PATENT DOCUMENTS

| | | | |
|---|---|---|---|
| DE | 20113695 U1 | 1/2003 | |
| DE | 20113695 U1 | 2/2003 | |

(Continued)

OTHER PUBLICATIONS

Panduit "Panduct® Panelmax™ Noise Shield" product bulletin; Feb. 2010 (2 pages).

(Continued)

*Primary Examiner* — Angel R Estrada
(74) *Attorney, Agent, or Firm* — Christopher S. Clancy; James H. Williams

(57) ABSTRACT

Certain embodiments of the present invention provide a duct for a shielded wireway system. The duct includes a bottom wall, two sidewalls extending from the bottom wall, and a plurality of fingers extending from each of the sidewalls. Adjacent fingers are connected by at least one bridging component. The bottom wall, the sidewalls, and a portion of the fingers, including the bridging component, are shielded.

20 Claims, 13 Drawing Sheets

(56) References Cited

U.S. PATENT DOCUMENTS

| | | |
|---|---|---|
| 7,544,893 B2 * | 6/2009 | Wallgren et al. ............... 174/93 |
| 2001/0022231 A1 | 9/2001 | Dyer |
| 2009/0050345 A1 | 2/2009 | Delfosse et al. |

FOREIGN PATENT DOCUMENTS

| | | |
|---|---|---|
| EP | 0512241 A1 | 11/1992 |
| EP | 2148403 A1 | 1/2010 |
| FR | 2777129 A1 | 10/1999 |
| JP | 10014051 A | 1/1998 |
| JP | 2001095127 A | 4/2001 |
| WO | 2006031805 A2 | 3/2006 |

OTHER PUBLICATIONS

Seiwa Electric Manufacturing "Shielded Ducts" product outline, features, specifications and characteristic data; undated (1 page).

* cited by examiner

US 8,704,093 B2

SHIELDED WIREWAY SYSTEMS

CROSS REFERENCE TO RELATED APPLICATIONS

This application claims priority to U.S. Provisional Patent Application No. 61/424,740, filed on Dec. 20, 2010, which is incorporated by reference in its entirety.

BACKGROUND OF THE INVENTION

The present invention relates to wireway systems, and more particularly, shielded wireway systems.

Unshielded wireway systems are typically made of plastic, which is relatively inexpensive and lightweight compared to metal. However, plastic is not conductive, and therefore, does not dissipate electrical noise effectively. Additionally, unshielded wireway systems typically have slotted walls, which further limit their ability to dissipate electrical noise effectively. Consequently, wires routed through unshielded wireway systems, for example, in industrial control systems, are susceptible to electrical noise generated by wires and other electrical components, such as variable frequency drives, power supplies, and high speed counters, in close proximity to the unshielded wireway systems.

Conversely, shielded wireway systems are typically made of metal, which is conductive, and therefore, dissipates electrical noise effectively. However, metal is relatively expensive and weighty compared to plastic. Additionally, shielded wireway systems typically have solid walls, which limit their accessibility.

Therefore, there is a need for shielded wireway systems that are inexpensive, lightweight, and accessible.

SUMMARY OF THE INVENTION

Certain embodiments of the present invention provide a duct for a shielded wireway system. The duct includes a bottom wall, two sidewalls extending from the bottom wall, and a plurality of fingers extending from each of the sidewalls. Adjacent fingers are connected by at least one bridging component. The bottom wall, the sidewalls, and a portion of the fingers, including the bridging component, are shielded.

DETAILED DESCRIPTION

FIGS. 1-11 illustrate a shielded wireway system 100 according to several embodiments of the present invention.

Figure 1:
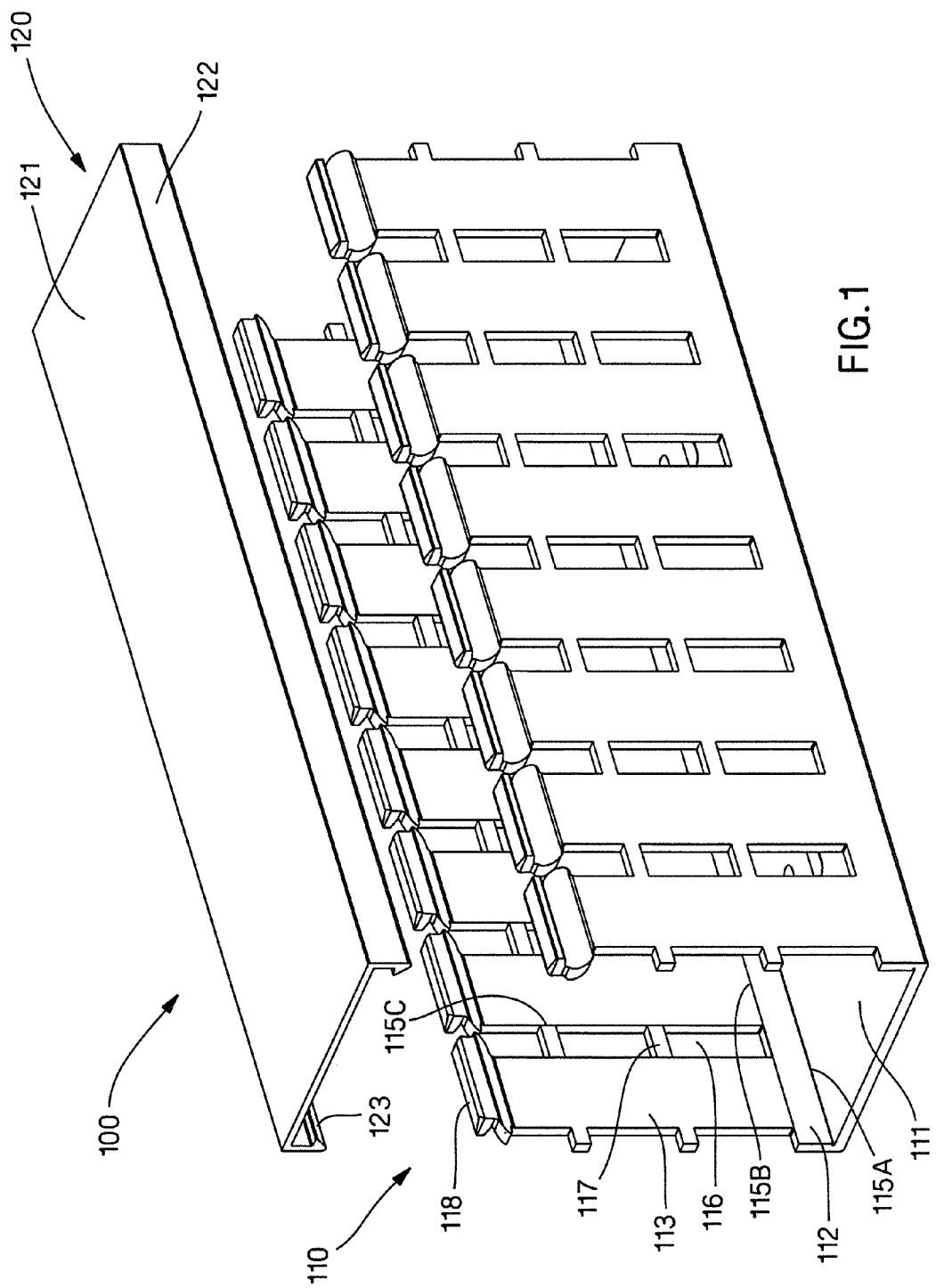
FIG. 1 is a perspective view of a shielded wireway system according to an embodiment of the present invention.

As shown in FIG. 1, the shielded wireway system 100 includes a duct 110 and a cover 120. Preferably, the duct 110 and the cover 120 are made of plastic, such as polyvinylchloride ("PVC"), or other non-conductive materials, but it is likewise contemplated that the duct 110 and/or the cover 120 are made of metal, such as steel, or other conductive materials.

Figure 2:
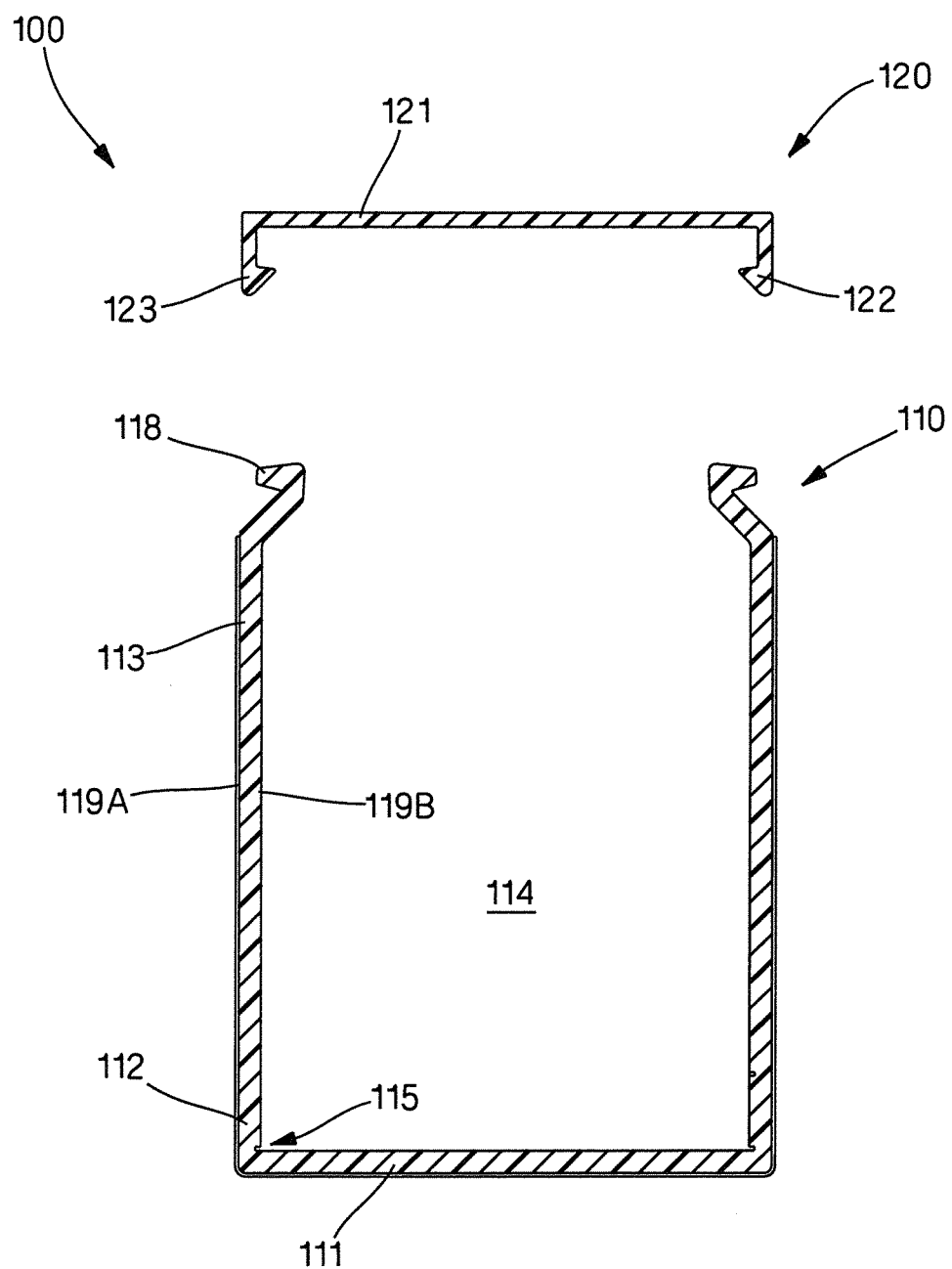
FIG. 2 is a cross-sectional view of the shielded wireway system of FIG. 1.

As shown in FIG. 2, the duct 110 includes a bottom wall 111, two sidewalls 112 extending from the bottom wall 111, and a plurality of fingers 113 extending from each of the sidewalls 112. Preferably, the sidewalls 112 extend along respective longitudinal edges of the bottom wall 111 and are perpendicular to the bottom wall 111. The fingers 113 are parallel to the sidewalls 112. Together, the bottom wall 111, the sidewalls 112, and the fingers 113 form a channel 114, such as a U-shaped channel, for routing wires therethrough.

Figure 3:
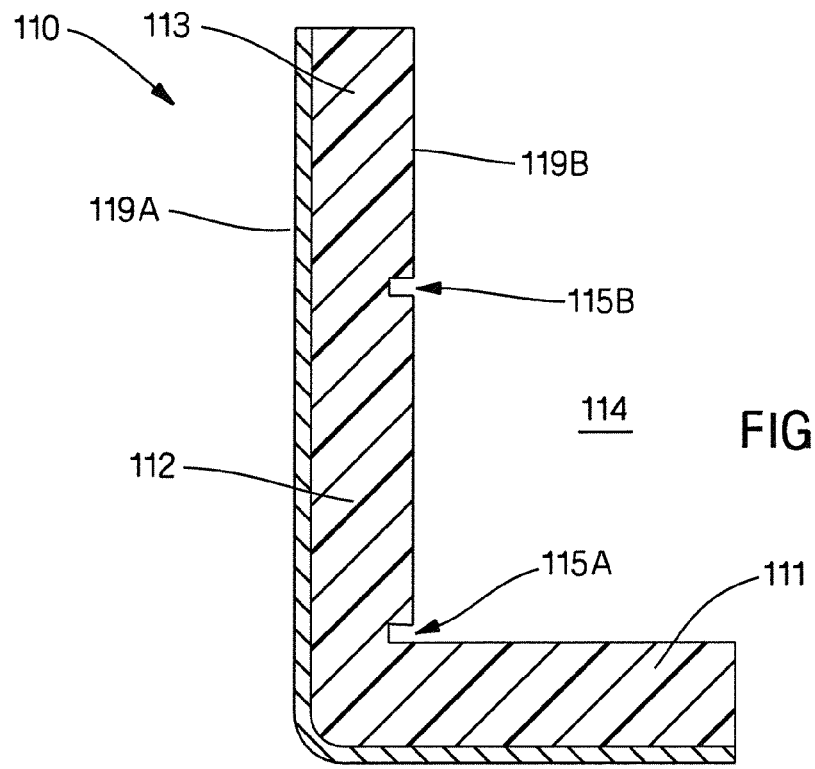
FIG. 3 is an enlarged view of the shielded wireway system of FIG. 2.
Figure 4:
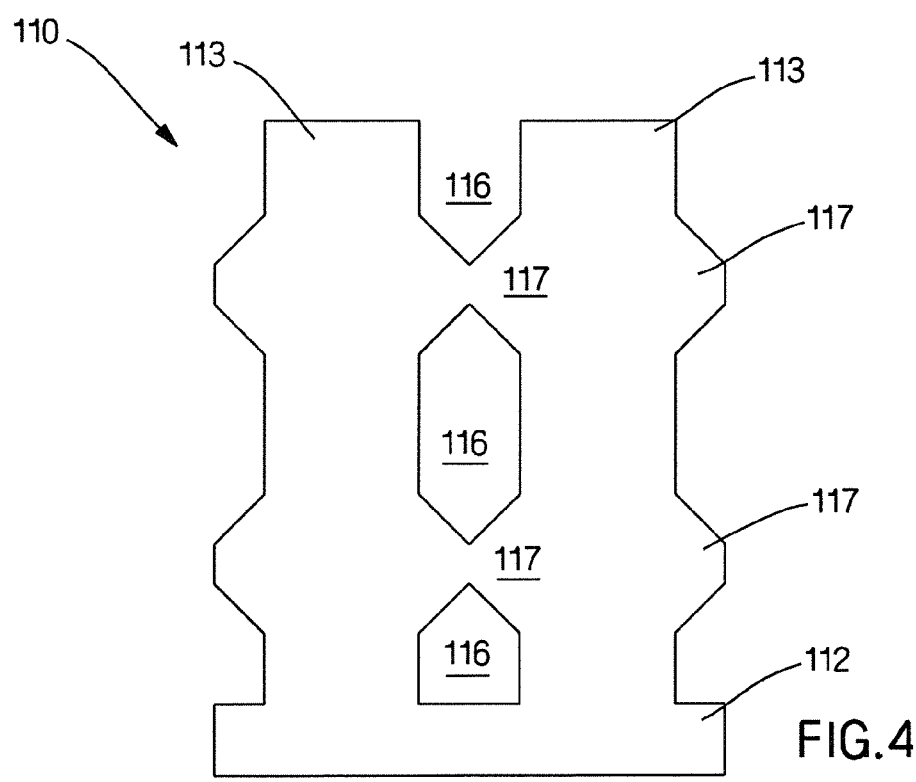
FIG. 4 is a partial side view of a shielded wireway system according to an alternative embodiment of the present invention.
Figure 5:
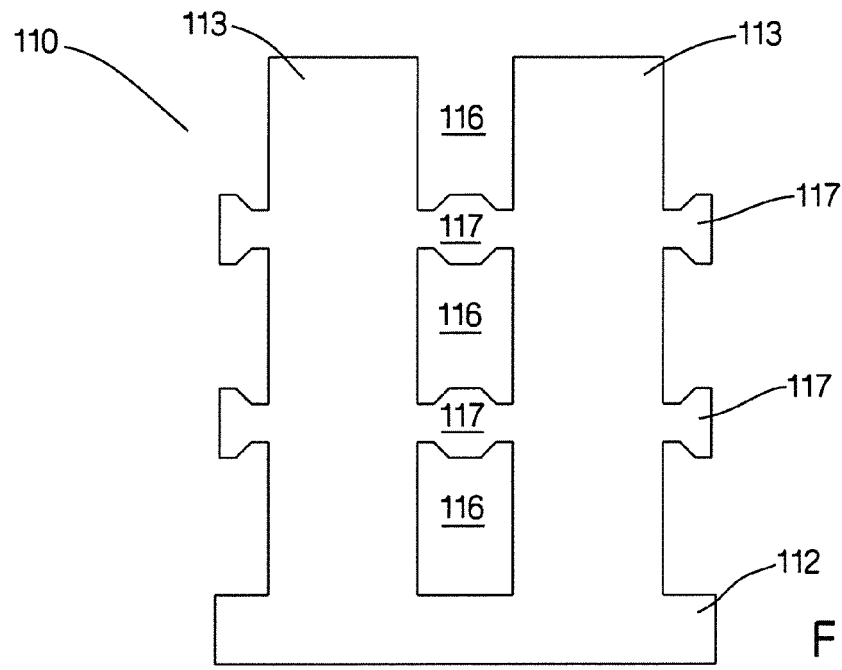
FIG. 5 is a partial side view of a shielded wireway system according to an alternative embodiment of the present invention.
Figure 6:
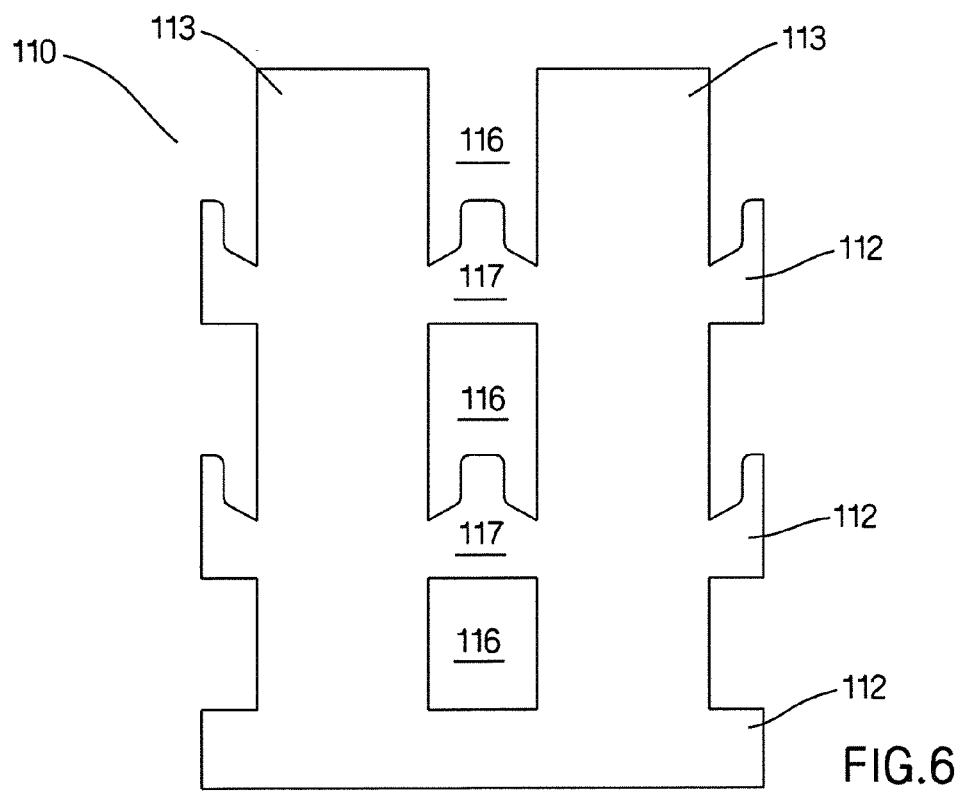
FIG. 6 is a partial side view of a shielded wireway system according to an alternative embodiment of the present invention.

As shown in FIG. 3, the duct 110 includes notches 115A disposed at the intersections of the bottom wall 111 and the sidewalls 112 for tool-less removal of the sidewalls 112 from the bottom wall 111. Additionally, the duct 110 includes notches 115E disposed at the intersections of the sidewalls 112 and the fingers 113 for tool-less removal of the fingers 113 from the sidewalls 112.

Referring again to FIG. 1, adjacent fingers 113 are separated by at least one slot 116, which provides access to the channel 114. In certain embodiments of the present invention, adjacent fingers 113 are connected by at least one bridging component 117 (FIGS. 1, 4-6, and 11), and preferably, a plurality of bridging components 117. The duct 110 includes notches 115C disposed at the intersections of the fingers 113 and the bridging components 117 for tool-less removal of the bridging components 117 from the fingers 113. Each of the fingers 113 includes a latch 118, preferably disposed at a distal end thereof, for securing the cover 120 to the duct 110.

As described above, the duct 110 may be perforated or scored (e.g., notches 115A, 115B, and 115C) for tool-less removal of the sidewalls 112, the fingers 113, and/or the bridging components 114.

Figure 7:
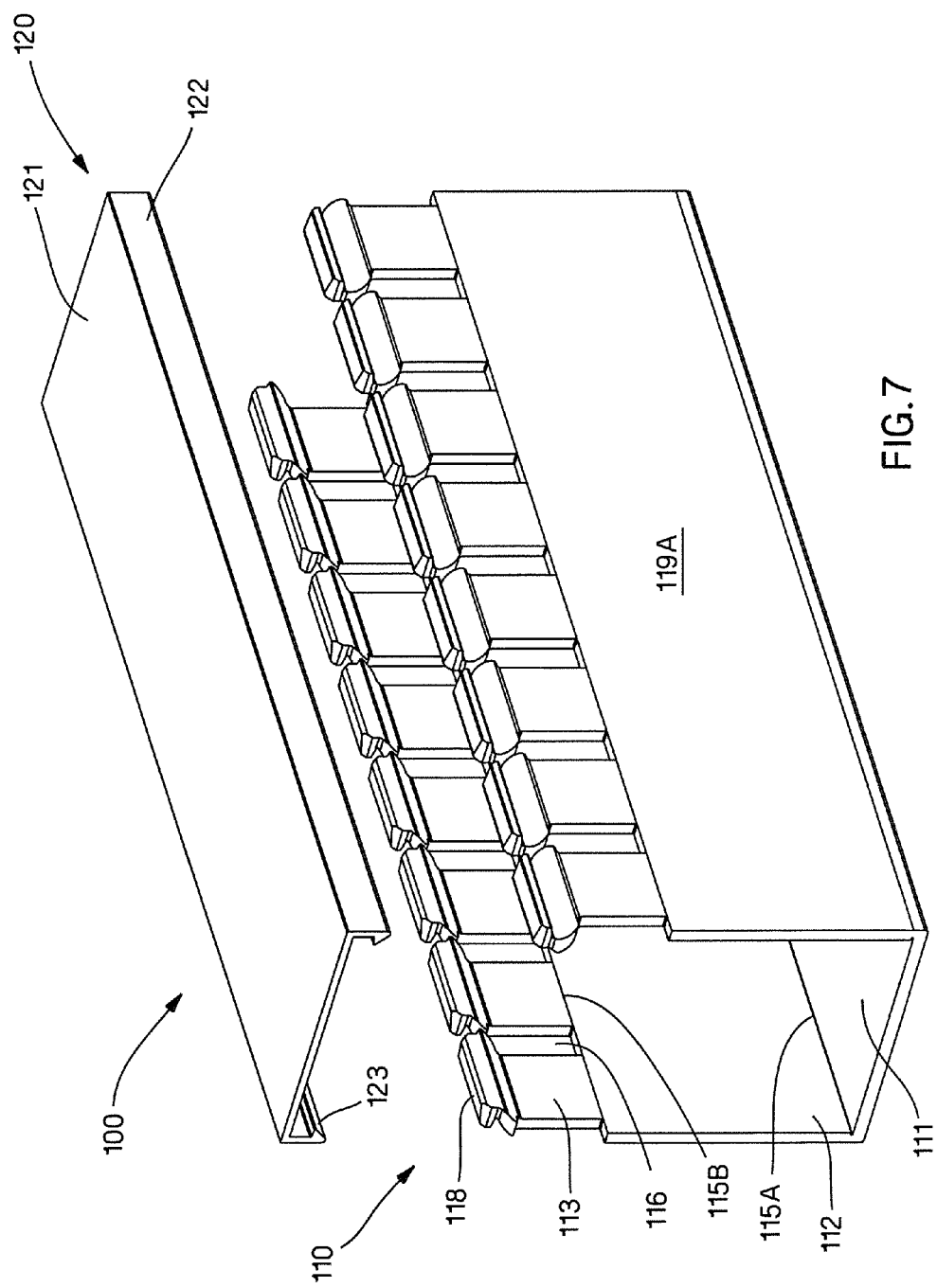
FIG. 7 is a perspective view of a shielded wireway system according to an alternative embodiment of the present invention.
Figure 8:
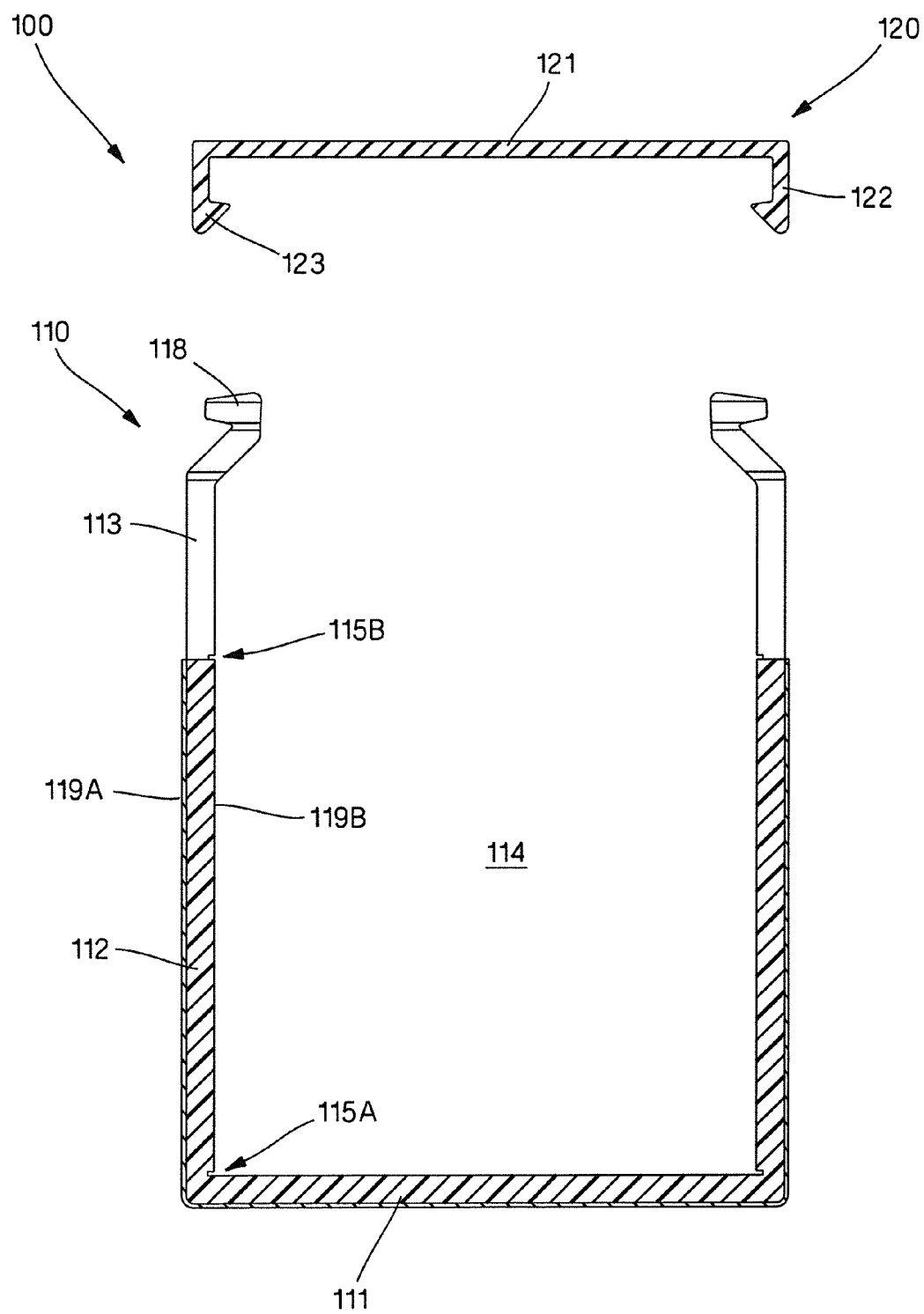
FIG. 8 is a cross-sectional view of the shielded wireway system of FIG. 7.
Figures 9, 10:
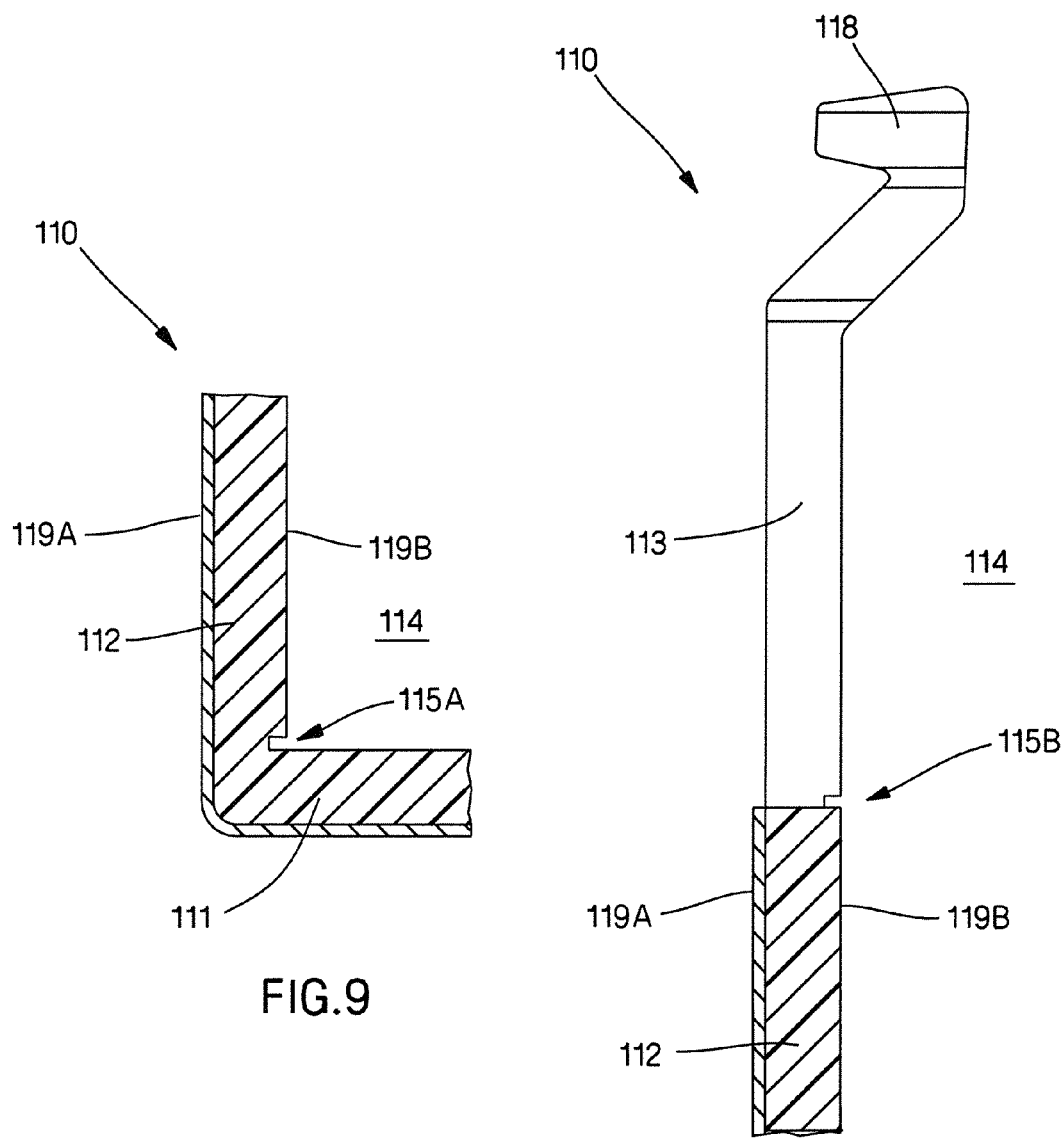
FIG. 9 is an enlarged view of the shielded wireway system of FIG. 8.
FIG. 10 is an enlarged view of the shielded wireway system of FIG. 8.

Preferably, the duct 110, or at least a portion of the duct 110, is shielded. For example, as shown in FIGS. 2 and 3, the bottom wall 111, the sidewalls 112, and the portion of the fingers 113 below the latches 118, including the bridging components 117, include a conductive layer 119A, such as conductive foil (e.g., aluminum, copper, and/or nickel), and a non-conductive layer 119B, such as plastic (e.g., PVC). Preferably, the conductive layer 119A is disposed on the outside of the duct 110 and the non-conductive layer 119B is disposed on the inside of the duct 110. The remaining portion of the fingers 113, including the latches 118, includes only the non-conductive layer 119B. Alternatively, as shown in FIGS. 7-9, only the bottom wall 111 and the sidewalls 112 include the conductive layer 119A and the non-conductive layer 119B. The fingers 113, including the latches 118, include only the non-conductive layer 119B. Alternatively, conductive fillers, such as metal flakes and powders (e.g., aluminum, copper, and/or nickel), may be integrally formed with the non-conductive layer 119B, potentially eliminating the need for a separate conductive layer 119A. Alternatively, the duct 110, or at least a portion of the duct 110, may be made of metal, such as steel, or other conductive materials, as described above.

As shown in FIGS. 2, 3, 7, and 8, the bottom wall 112 is shielded, but it is likewise contemplated that the bottom wall 112, or at least a portion of the bottom wall 112, is not shielded.

As shown in FIGS. 1 and 2, the height of the sidewalls 112 is relatively small compared to the height of the fingers 113, and therefore, the sidewalls 112 and the fingers 113 are shielded. Conversely, as shown in FIGS. 7 and 8, the height of the sidewalls 112 is relatively large compared to the height of the fingers 113, and therefore, the sidewalls 112 are shielded and the fingers 113 are not shielded.

Referring again to FIG. 2, the cover 120 includes a top wall 121 and a pair of sidewalls 122 extending from the top wall 121. Preferably, the sidewalls 122 extend along respective longitudinal edges of the top wall 121 and are perpendicular to the top wall 121.

The sidewalls 122 include a latch 123, preferably disposed at a distal end thereof, for securing the cover 120 to the duct 110. The latch 123 engages the corresponding latch 118 on the fingers 113 of the duct 110.

Preferably, the cover 120 is not shielded (FIGS. 2 and 9), but it is likewise contemplated that the cover 120, or at least a portion of the cover 120, is shielded.

Figure 11:
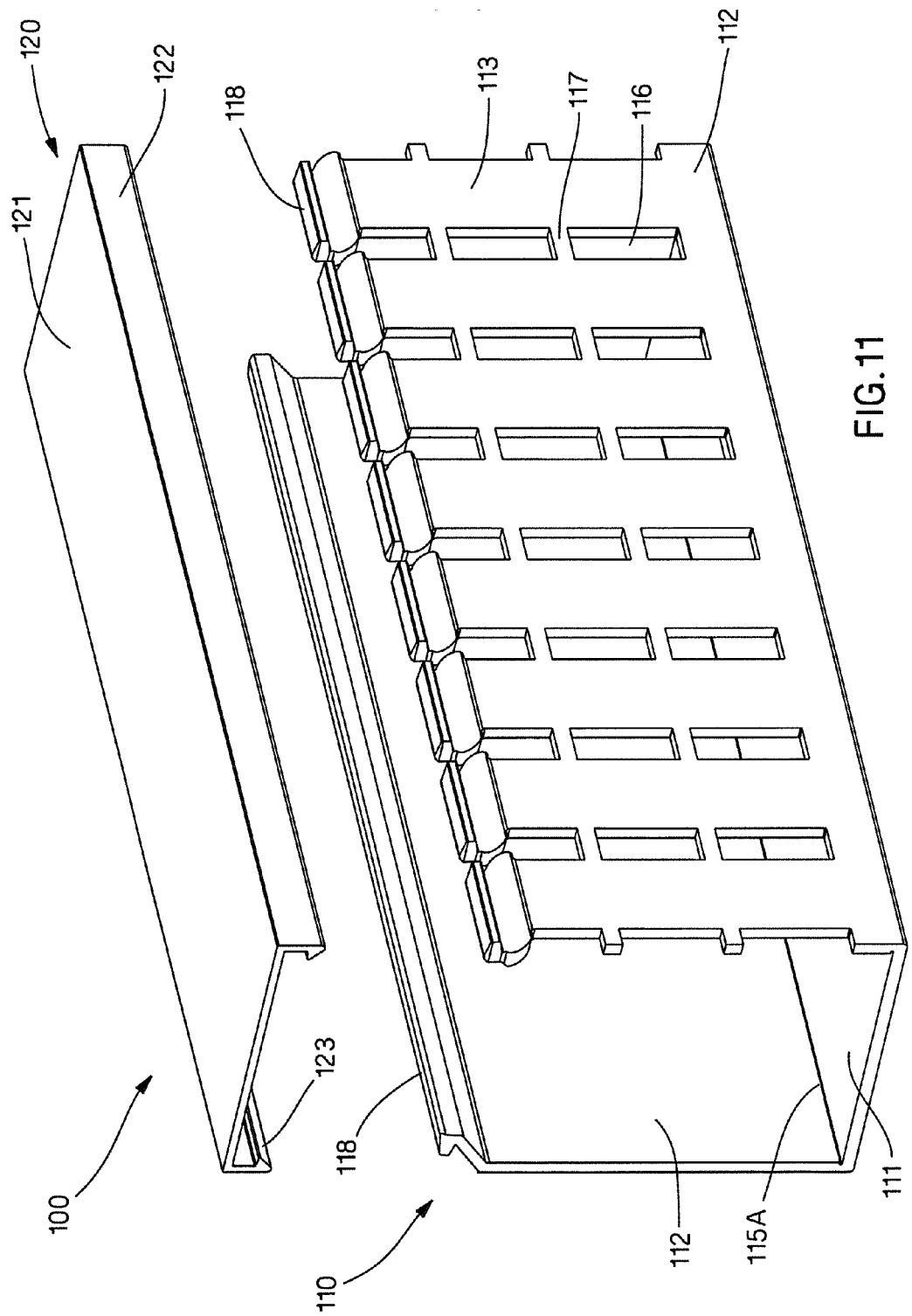
FIG. 11 is a perspective view of a shielded wireway system according to an alternative embodiment of the present invention.

As shown in FIGS. 1 and 7, the sides of the duct 110 are the same, but it is likewise contemplated that the sides of the duct 110 may be different. For example, as shown in FIG. 11, the duct 110 includes a slotted side similar to the slotted sides of FIG. 1 and a solid side similar to the sidewall 112 of FIG. 7.

FIGS. 12-17 illustrate a shielded divider wall 200 according to an embodiment of the present invention.

Figure 12:
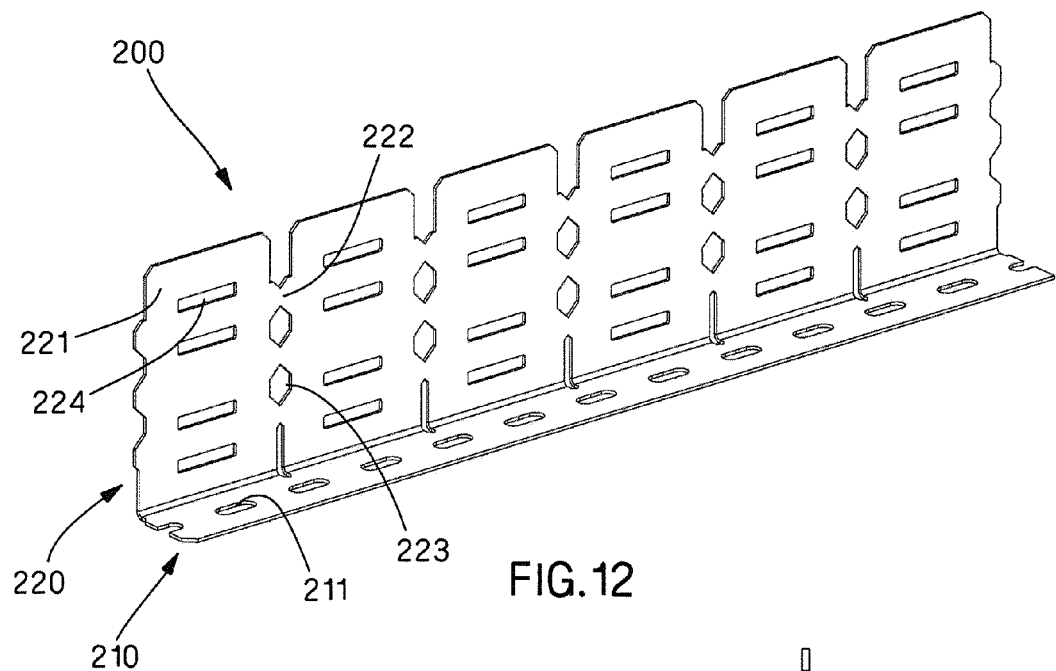
FIG. 12 is a perspective view of a shielded divider wall according to an embodiment of the present invention.
Figure 13:
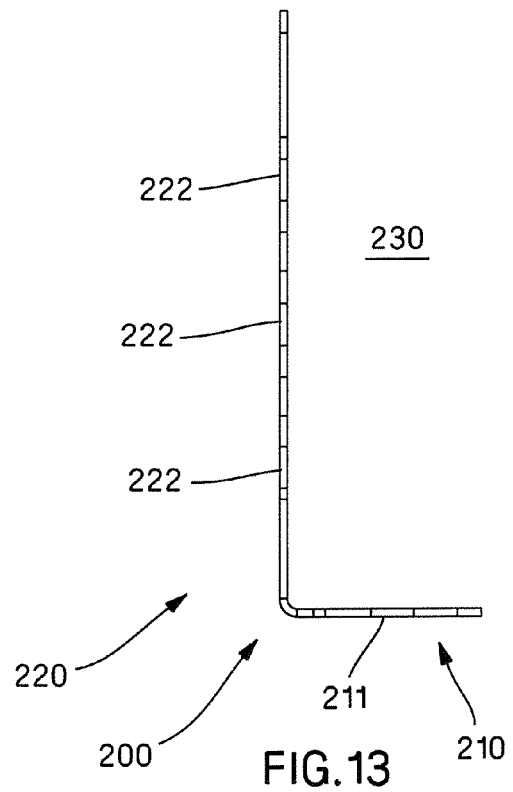
FIG. 13 is a side view of the shielded divider wall of FIG. 12.

As shown in FIGS. 12 and 13, the shielded divider wall 200 includes a bottom wall 210 and a sidewall 220 extending from the bottom wall 210. Preferably, the sidewall 220 extends along a longitudinal edge of the bottom wall 210 and is perpendicular to the bottom wall 210. Together, the bottom wall 210 and the sidewalls 220 form a channel 230, such as an L-shaped channel, for routing wires therethrough. However, it is likewise contemplated that wires may be routed along either side or both sides of the shielded divider 200.

Figure 14:
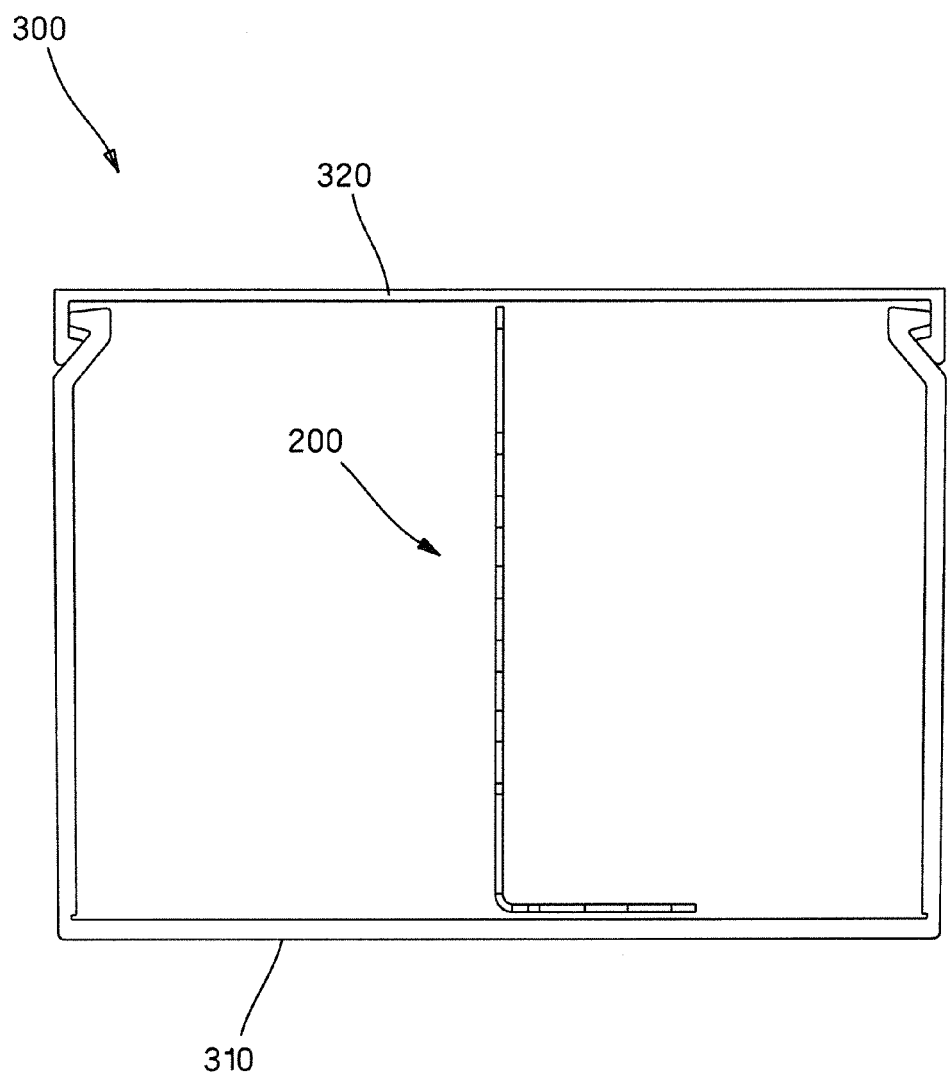
FIG. 14 is a side view of the shielded divider wall of FIG. 12 positioned in a wireway system.
Figure 15:
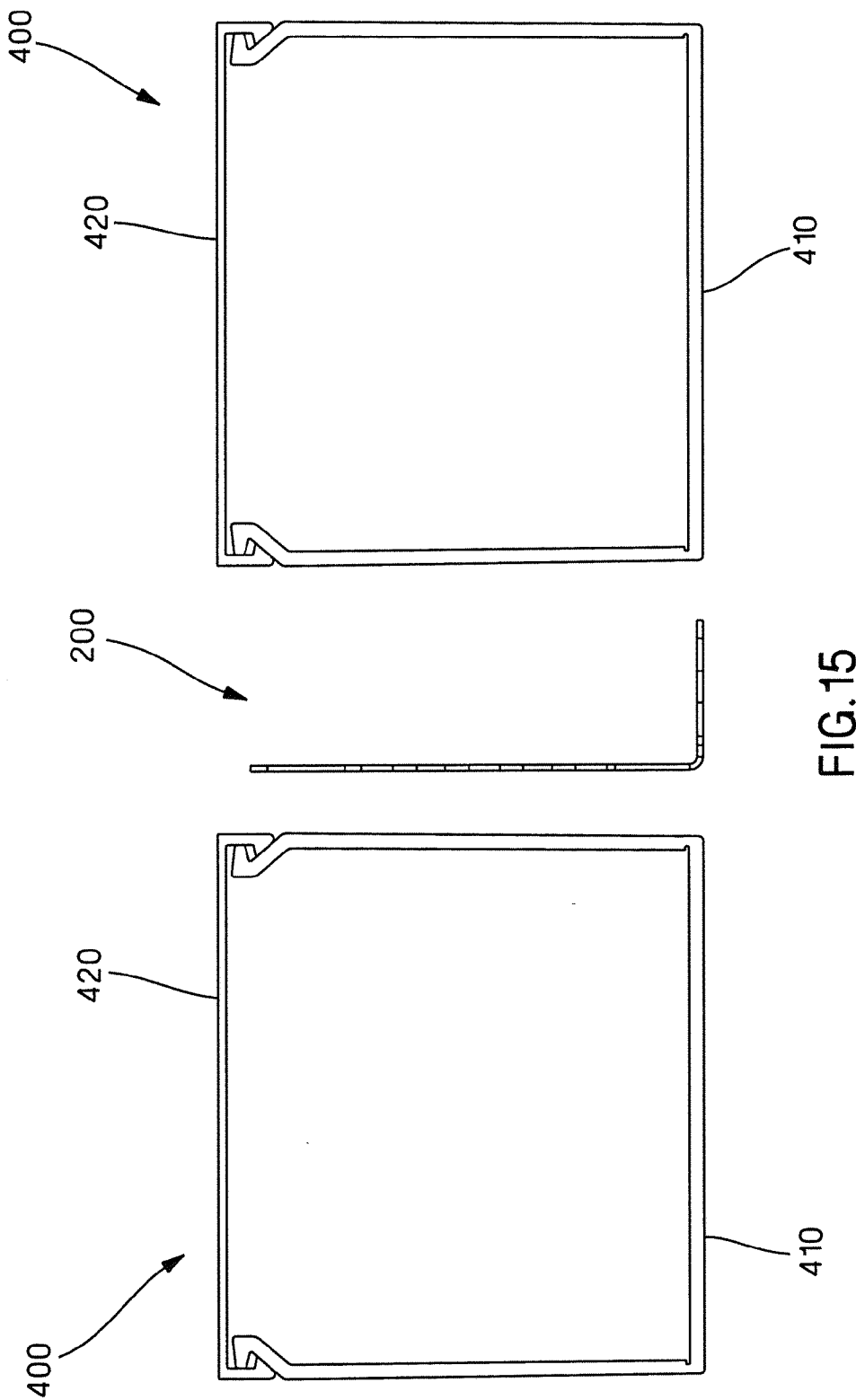
FIG. 15 is a side view of the shielded divider wall of FIG. 12 positioned between two wireway systems.
Figure 16:
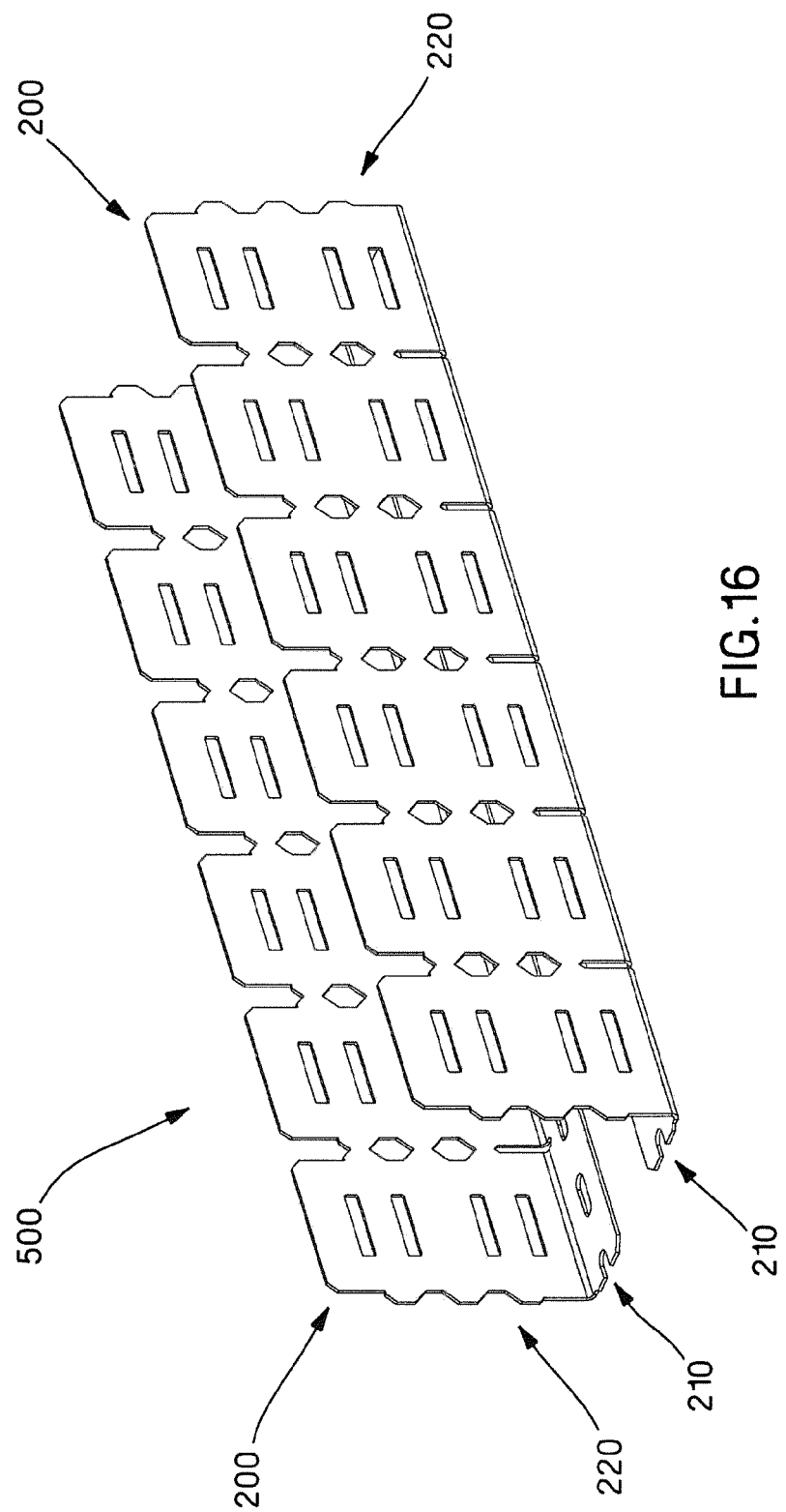
FIG. 16 is a perspective view of two of the shielded divider walls of FIG. 12 positioned to form a U-shaped channel.
Figure 17:
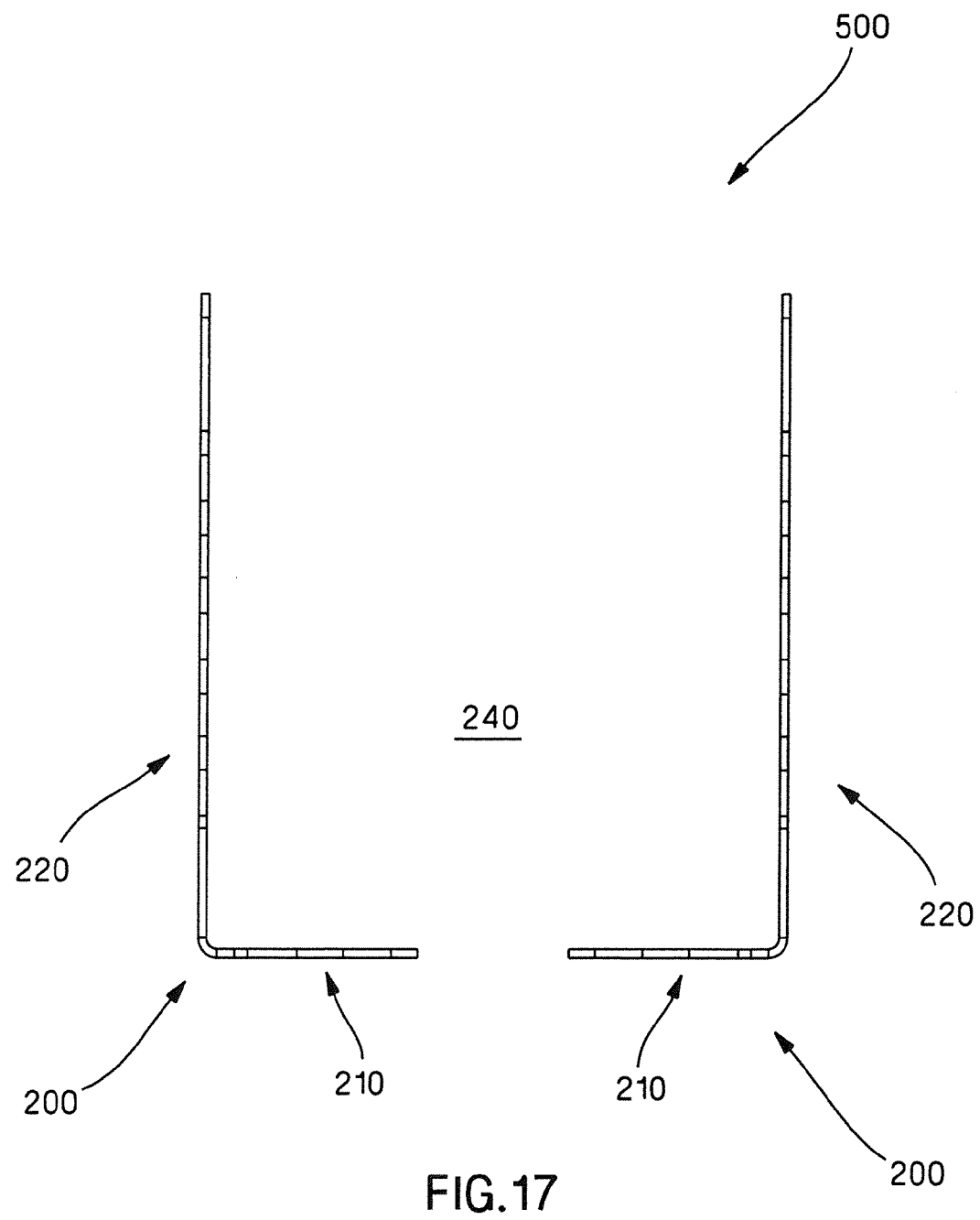
FIG. 17 is a side view of the shielded divider walls of FIG. 16.

The bottom wall 210 includes a plurality of mounting openings 211 for mounting the shielded divider wall 200 to a support structure, such as a wireway system or an industrial control system. For example, as shown in FIG. 14, the shielded divider wall 200 is positioned in a wireway system 300, including a duct 310 and a cover 320, minimizing noise between wires routed in the wireway system. Alternatively, as shown in FIG. 15, the shielded divider wall 200 is positioned between two wireway systems 400, including a duct 410 and a cover 420, minimizing noise between wires routed in the wireway systems. Alternatively, as shown in FIGS. 16 and 17, two shielded divider walls 200 are positioned to form a shielded wireway system 500, which is similar to the shielded wireway system 100, and more particularly, the duct 110 of FIG. 1. Together, the bottom walls 210 and the sidewalls 220 of the shielded divider wall 200 form a channel 240, such as a U-shaped channel, for routing wires therethrough. It is likewise contemplated that the shielded divider wall 200 may be positioned in or between other noise-generating systems, such as industrial control systems, and/or between wireway systems and the other noise-generating systems.

Referring again to FIGS. 12 and 13, the sidewall 220 includes a plurality of wall sections 221. Adjacent wall sections 221 are connected by a plurality of bridging components 222, which form a plurality of cable pass-through openings 223 therebetween.

Each of the wall sections 221 includes a plurality of cable-tie openings 224. Preferably, the cable-tie openings 224 are offset from the bridging components 222 so as to maintain a conductive path between adjacent wall sections 221.

Preferably, the shielded divider wall 200 is made of metal, such as steel, or other conductive materials, but it is likewise contemplated that the shielded divider wall 200 is made of plastic, such as polyvinylchloride ("PVC"), or other non-conductive materials that are combined with metal, such as aluminum, copper, and nickel, or other conductive materials, as described above.

As shown in FIG. 12, the shielded divider wall 200 includes six wall sections 221, but it is likewise contemplated that the shielded divider wall 200 may include any number of wall sections 221. Additionally, one or more of the wall sections 221 may be removed to achieve a desired length. For example, the wall sections 221 may be removed from the shielded divider wall 200 using a cutting tool, such as shears or snips. Alternatively, the shielded divider wall 200 may be perforated or scored for tool-less removal of the wall sections 221.

While this invention has been described in conjunction with the exemplary embodiments outlined above, various alternatives, modifications, variations, and/or improvements, whether known or presently unforeseen, may become apparent. Accordingly, the exemplary embodiments of the invention as set forth above are intended to be illustrative, not limiting. Various changes may be made without departing from the spirit and scope of the invention.

The invention claimed is:

1. A duct for a shielded wireway system, the duct comprising:
    a bottom wall;
    two sidewalls, each of the sidewalls extending from the bottom wall and having a top surface parallel to the bottom wall;
    a plurality of fingers extending from the top surface of each of the sidewalls, wherein adjacent fingers are fixedly connected by a plurality of bridging components spaced apart from the top surface of each of the sidewalls,
    wherein the bottom wall, the sidewalls, and at least a portion of the fingers, including the bridging components, are shielded.

2. The duct of claim 1, wherein the sidewalls extend along respective longitudinal edges of the bottom wall.

3. The duct of claim 1, wherein the sidewalls are perpendicular to the bottom wall.

4. The duct of claim 1, wherein the fingers are parallel to the sidewalls.

5. The duct of claim 1, wherein adjacent fingers are separated by at least one slot.

6. The duct of claim 1, wherein the bottom wall, the sidewalls, and the fingers form a channel for routing wires.

7. The duct of claim 6, wherein the channel is U-shaped.

8. The duct of claim 1, wherein the bottom wall, the sidewalls, and at least a portion of the fingers, including the bridging components, include a conductive layer and a non-conductive layer.

9. The duct of claim 8, wherein the conductive layer is disposed on the outside of the duct and the non-conductive layer is disposed on the inside of the duct.

10. The duct of claim 8, wherein the conductive layer includes conductive foil.

11. The duct of claim 8, wherein the conductive layer includes conductive filler integrally formed with the non-conductive layer.

12. The duct of claim 1, wherein each of the fingers includes a latch for securing a cover to the duct.

13. The duct of claim 12, wherein the latch is disposed at a distal end of each of the fingers.

14. The duct of claim 1, wherein the shielded wireway system includes a cover removably connected to the duct.

15. The duct of claim 14, wherein at least a portion of the cover is shielded.

16. The duct of claim 14, wherein the cover includes a top wall and two sidewalls extending from the top wall.

17. The duct of claim 16, wherein the sidewalls extend along respective longitudinal edges of the top wall.

18. The duct of claim 16, wherein the sidewalls are perpendicular to the top wall.

19. The duct of claim 16, wherein each of the sidewalls includes a latch for engaging corresponding latches on the fingers of the duct.

20. The duct of claim 19, wherein the latch is disposed at a distal end of each of the sidewalls.

* * * * *

UNITED STATES PATENT AND TRADEMARK OFFICE
CERTIFICATE OF CORRECTION

| | |
|---|---|
| PATENT NO. | : 8,704,093 B2 |
| APPLICATION NO. | : 13/323318 |
| DATED | : April 22, 2014 |
| INVENTOR(S) | : Michael D. Asztalos et al. |

It is certified that error appears in the above-identified patent and that said Letters Patent is hereby corrected as shown below:

In The Specification

Column 2, line 45 which reads "...notches 115E disposed at the intersections..." should read "...notches 115B disposed at the intersections..."

Column 4, line 52 which reads "...bottom wall;" should read "... bottom wall; and"

Signed and Sealed this
Twenty-fourth Day of March, 2015

Michelle K. Lee
*Director of the United States Patent and Trademark Office*